United States Patent
Huang et al.

(10) Patent No.: US 11,430,915 B2
(45) Date of Patent: Aug. 30, 2022

(54) ULTRAVIOLET LED EPITAXIAL PRODUCTION METHOD AND ULTRAVIOLET LED

(71) Applicant: MA'ANSHAN JASON SEMICONDUCTOR CO., LTD., Maanshan (CN)

(72) Inventors: Xiaohui Huang, Maanshan (CN); Jian Kang, Maanshan (CN); Yuanzhi Zheng, Maanshan (CN); Xudong Liang, Maanshan (CN); Xiangdong Chen, Maanshan (CN)

(73) Assignee: MA'ANSHAN JASON SEMICONDUCTOR CO., LTD., Maanshan (CN)

( * ) Notice: Subject to any disclaimer, the term of this patent is extended or adjusted under 35 U.S.C. 154(b) by 266 days.

(21) Appl. No.: 16/659,457

(22) Filed: Oct. 21, 2019

(65) Prior Publication Data
US 2020/0185567 A1 Jun. 11, 2020

(30) Foreign Application Priority Data
Dec. 5, 2018 (CN) .......................... 201811478456.3

(51) Int. Cl.
*H01L 33/06* (2010.01)
*H01L 33/30* (2010.01)
(Continued)

(52) U.S. Cl.
CPC ........ *H01L 33/305* (2013.01); *H01L 33/0062* (2013.01); *H01L 33/06* (2013.01);
(Continued)

(58) Field of Classification Search
CPC ..... H01L 33/0062; H01L 33/06; H01L 33/08; H01L 33/12
See application file for complete search history.

(56) References Cited

U.S. PATENT DOCUMENTS

2017/0309785 A1* 10/2017 Watanabe ........... H01L 33/0075

FOREIGN PATENT DOCUMENTS

| CN | 103560188 A | 2/2014 |
|----|-------------|--------|
| CN | 103779450 A | 5/2014 |
| CN | 105489718 A | 4/2016 |

OTHER PUBLICATIONS

The Chinese First Examination Report and Search Report of corresponding Chinese application No. 201811478456.3, dated Aug. 27, 2019.

* cited by examiner

*Primary Examiner* — Trang Q Tran
(74) *Attorney, Agent, or Firm* — J.C. Patents (57) ABSTRACT

The present disclosure provides an ultraviolet LED epitaxial production method and an ultraviolet LED, where the method includes: pre-introducing a metal source and a group-V reactant on a substrate, to form a buffer layer through decomposition at a first temperature; growing an N-doped $Al_wGa_{1-w}N$ layer on the buffer layer at a second temperature; growing a multi-section LED structure on the N-doped $Al_wGa_{1-w}N$ layer at a third temperature, wherein a number of sections of the multi-section LED structure is in a range of 2 to 50; and each section of the LED structure comprises an $Al_xGa_{1-x}N/Al_yGa_{1-y}N$ multi-quantum well structure and a P-doped $Al_mGa_{1-m}N$ layer, and the multi-section LED structure emits light of one or more wavelengths, which realizes that a single ultraviolet LED emits ultraviolet light of different wavelengths, thereby improving the luminous efficiency of the ultraviolet LED.

20 Claims, 4 Drawing Sheets

(51) Int. Cl.
*H01L 33/00* (2010.01)
*H01L 33/08* (2010.01)
*H01L 33/12* (2010.01)
*H01L 33/14* (2010.01)

(52) U.S. Cl.
CPC .............. *H01L 33/08* (2013.01); *H01L 33/12* (2013.01); *H01L 33/145* (2013.01)

ULTRAVIOLET LED EPITAXIAL PRODUCTION METHOD AND ULTRAVIOLET LED

CROSS-REFERENCE TO RELATED APPLICATION

This application claims priority to Chinese Patent Application No. 201811478456.3, filed on Dec. 5, 2018, which is hereby incorporated by reference in its entirety.

TECHNICAL FIELD

The disclosure relates to the technical field of ultraviolet light emitting diodes (LEDs), in particular, to an ultraviolet LED epitaxial production method and an ultraviolet LED.

BACKGROUND

With the continuous development of science and technology in China, both material and spiritual life have been greatly improved. However, the increase in smog and water pollution in recent years has seriously affected people's quality of life. In order to protect people's health, various disinfection and sterilization devices have been developed, such as air purifiers and water treatment devices. Main sterilizing functional components of these sterilizing devices are ultraviolet lamps with wavelength of 200 nm to 280 nm, and currently, it is most popular to use deep ultraviolet light-emitting diode (LED) lamps. At the same time, it has been found in the medicine that ultraviolet lamps with wavelength of 280 nm to 320 nm have excellent phototherapy effect, especially for the treatment of vitiligo, and have been widely used in the field of medical phototherapy. The ultraviolet lamps with wavelength of 320 nm to 365 nm have good light curing function and are often used in nail curing, printing curing and other curing fields.

In the prior art, due to the sterilizing function of the deep ultraviolet LEDs, research on the deep ultraviolet LEDs has become popular. Currently, AlGaN is used a main growth material for the deep ultraviolet LEDs, and a desired light emitting structure is grown by CVD epitaxial growth method. A most basic structure includes an AlN buffer layer, an un-doped AlGaN layer, an N-type AlGaN layer, an AlGaN quantum well layer, an AlGaN electronic barrier layer and a P-type GaN layer.

However, in the prior art, the light emitting layer in the ultraviolet LED is single, and a single ultraviolet LED can emit ultraviolet light of only one type of wavelength, resulting in a relatively low luminous efficiency of the ultraviolet LED.

SUMMARY

The present disclosure provides an ultraviolet LED epitaxial production method and an ultraviolet LED, in order to realize that a single ultraviolet LED emits ultraviolet light of different wavelengths, so that different ultraviolet LED functions are realized, thereby improving the luminous efficiency of the ultraviolet LED.

In a first aspect, the embodiment of the present disclosure provides an ultraviolet LED epitaxial production method, including:

pre-introducing a metal source and a group-V reactant on a substrate, to form a buffer layer through decomposition at a first temperature;

growing an N-doped $Al_wGa_{1-w}N$ layer on the buffer layer at a second temperature;

growing a multi-section LED structure on the N-doped $Al_wGa_{1-w}N$ layer at a third temperature, wherein a number of sections of the multi-section LED structure is in a range of 2 to 50; and each section of the LED structure comprises an $Al_xGa_{1-x}N/Al_yGa_{1-y}N$ multi-quantum well structure and a P-doped $Al_mGa_{1-m}N$ layer, and the multi-section LED structure emits light of one or more wavelengths.

Optionally, the ultraviolet led epitaxial production method according to the embodiment of the present disclosure further comprises:

growing an undoped $Al_vGa_{1-v}N$ layer on the buffer layer, and growing the N-doped $Al_wGa_{1-w}N$ layer on the undoped $Al_vGa_{1-v}N$ layer.

Optionally, the ultraviolet LED epitaxial production method according to the embodiment of the present disclosure further includes:

growing a P-doped GaN layer on the multi-section LED structure, a thickness of the P-doped GaN layer is in a range of 0 to 500 nm, and a doping concentration of the P-doped GaN layer is $1*10^{17}$ to $1*10^{20}$ cm$^{-3}$.

Optionally, in the ultraviolet led epitaxial production method according to the embodiment of the present disclosure, a thickness of the N-doped $Al_wGa_{1-w}N$ layer is in a range of 500 nm to 4000 nm, and a doping concentration of the N-doped $Al_wGa_{1-w}N$ layer is $1*10^{17}$ to $5*10^{19}$ cm$^{-3}$;

a thickness of the $Al_mGa_{1-m}N$ layer is in a range of 5 nm to 100 nm, and a doping concentration of the P-doped $Al_mGa_{1-m}N$ layer is $1*10^{17}$ to $1*10^{20}$ cm$^{-3}$.

Optionally, a thickness of the buffer layer is in a range of 0 to 5000 nm.

Optionally, the substrate is one of sapphire ($Al_2O_3$), Si, SiC, Glass, Cu, Ni and Cr.

Optionally, in the ultraviolet LED epitaxial production method according to the embodiment of the present disclosure, a number of periods of the $Al_xGa_{1-x}N/Al_yGa_{1-y}N$ multi-quantum well structure in each section of the LED structure is in a range of 2 to 50, a thickness of a period of the $Al_xGa_{1-x}N/Al_yGa_{1-y}N$ multi-quantum structure is in a range of 5 nm to 30 nm.

Optionally, in the $Al_xGa_{1-x}N/Al_yGa_{1-y}N$ multi-quantum well structure, an Al content of a quantum barrier layer $Al_xGa_{1-x}N$ is higher than an Al content of a quantum well layer $Al_yGa_{1-y}N$.

Optionally, an Al content of the P-doped $Al_mGa_{1-m}N$ layer in each section of the LED structure is higher than an Al content of the quantum well layer $Al_yGa_{1-y}N$;

an Al content of the N-doped $Al_wGa_{1-w}N$ layer is higher than an Al content of the quantum well layer $Al_yGa_{1-y}N$ in each section of the LED structure.

In a second aspect, the embodiments of the present disclosure provide an ultraviolet LED, where the ultraviolet LED is produced using the ultraviolet LED epitaxial production method according to the first aspect or any one of the optional implementations of the first aspect.

According to the ultraviolet LED epitaxial production method and the ultraviolet LED, the metal source and the group-V element are introduced to form the buffer layer through decomposition at the first temperature, then the N-doped $Al_wGa_{1-w}N$ layer is grown on the buffer layer at the second temperature, and finally the multi-section LED structure is grown on the N-doped $Al_wGa_{1-w}N$ layer at the third temperature, where the number of the sections of the multi-section LED structure is in the range of 2 to 50. Each section of the LED structure includes the AlxGa1-xN/AlyGa1-yN multi-quantum well structure and the P-doped AlmGa1-mN layer, and the multi-section LED structure emits light of one or more wavelengths. Since the multi-section LED structure is grown on the N-doped AlwGa1-wN layer at the third temperature, and each section of the LED structure includes the AlxGa1-xN/AlyGa1-yN multi-quantum structure and the P-doped AlmGa1-mN layer, which realizes that a single ultraviolet LED emits ultraviolet light of different wavelengths, thereby further implementing different ultraviolet LED functions and improving the luminous efficiency of the ultraviolet LED.

BRIEF DESCRIPTION OF DRAWINGS

In order to more clearly illustrate technical solutions in embodiments of the present application or the prior art, accompanying drawings required for describing the embodiments or the prior art will be briefly described below. Obviously, the accompanying drawings in the following description are some of the embodiments of the present application, and other drawings can be obtained by those skilled in the art based on these accompanying drawings without any creative effort.

REFERENCE SIGNS

0: Substrate
1: Buffer Layer
2: N-doped AlwGa1-wN layer
3: First section LED structure
4: Second section LED structure
5: Multi-section LED structure
31: Quantum barrier layer AlxGa1-xN
32: Quantum well layer AlyGa1-yN
33: P-doped AlmGa1-mN layer
41: Quantum barrier layer AltGa1-tN
42: Quantum well layer AluGa1-uN
43: P-doped AlnGa1-nN layer
6: Undoped AlvGa1-nv layer
7: P-doped GaN layer

DESCRIPTION OF EMBODIMENTS

In order to make the purpose, technical solutions and advantages of embodiments of the present disclosure more clear, the technical solutions in the embodiments of the present disclosure are clearly and completely described in the following with reference to accompanying drawings in the embodiments of the present disclosure. Obviously, the described embodiments are some, instead of all, of the embodiments of the present disclosure. Based on the embodiments in the present disclosure, all other embodiments obtained by those skilled in the art without any creative effort are within the scope of the present disclosure.

The terms "first", "second", "third", "fourth", etc. (if present) in the description and claims of the present disclosure and the above accompanying drawings are used to distinguish similar objects and are not necessarily used for describing a specific sequence or order. It is to be understood that the data used as such may be interchanged as appropriate, such that the embodiments of the disclosure described herein can be implemented, for example, in a sequence other than those illustrated or described herein. In addition, the terms "include" and "comprise" and any of their variations are intended to cover a non-exclusive inclusion, for example, a process, method, system, product, or device that includes a series of steps or units are not necessarily limited to the steps or units that are explicitly listed and may include other steps or units that are not explicitly listed or are inherent to such processes, methods, products or devices.

With the continuous development of science and technology in China, both material and spiritual life have been greatly improved. Ultraviolet LED lamps contribute a lot to the improvement of people's living standards. Ultraviolet lamps with wavelength of 200 nm to 280 nm have excellent phototherapy effect, especially for the treatment of vitiligo, and have been widely used in the field of medical phototherapy. The ultraviolet lamps with wavelength of 320 nm to 365 nm have good light curing function and are often used in nail curing, printing curing and other curing fields. In order to realize that a single ultraviolet LED can emit light of different wavelengths, thereby implementing various functions to improve the luminous efficiency of the ultraviolet LED, embodiments of the present disclosure provide an ultraviolet LED epitaxial production method and an ultraviolet LED.

An exemplary application scenario of the ultraviolet LED according to the embodiments of the present disclosure is described below.

In daily life, different functions of ultraviolet LEDs are from ultraviolet LEDs with different wavelengths. In use, the ultraviolet LEDs with different wavelengths are used for different functional requirements. In life, if it is needed to utilize different functions of ultraviolet LEDs with different wavelengths at the same time, a plurality of ultraviolet LED lamps are required. In order to enable a single ultraviolet LED to emit light of different wavelengths to achieve different functions, the embodiments of the present disclosure provide an ultraviolet LED epitaxial production method and an ultraviolet LED.

Embodiment I

Figure 1:
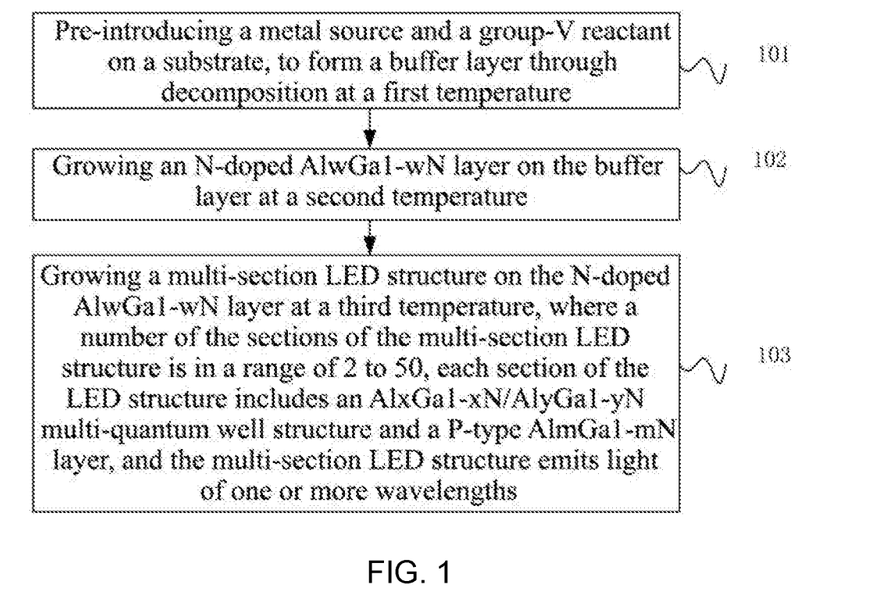
FIG. 1 is a flowchart of an ultraviolet LED epitaxial production method according to Embodiment I of the present disclosure.
Figure 2:
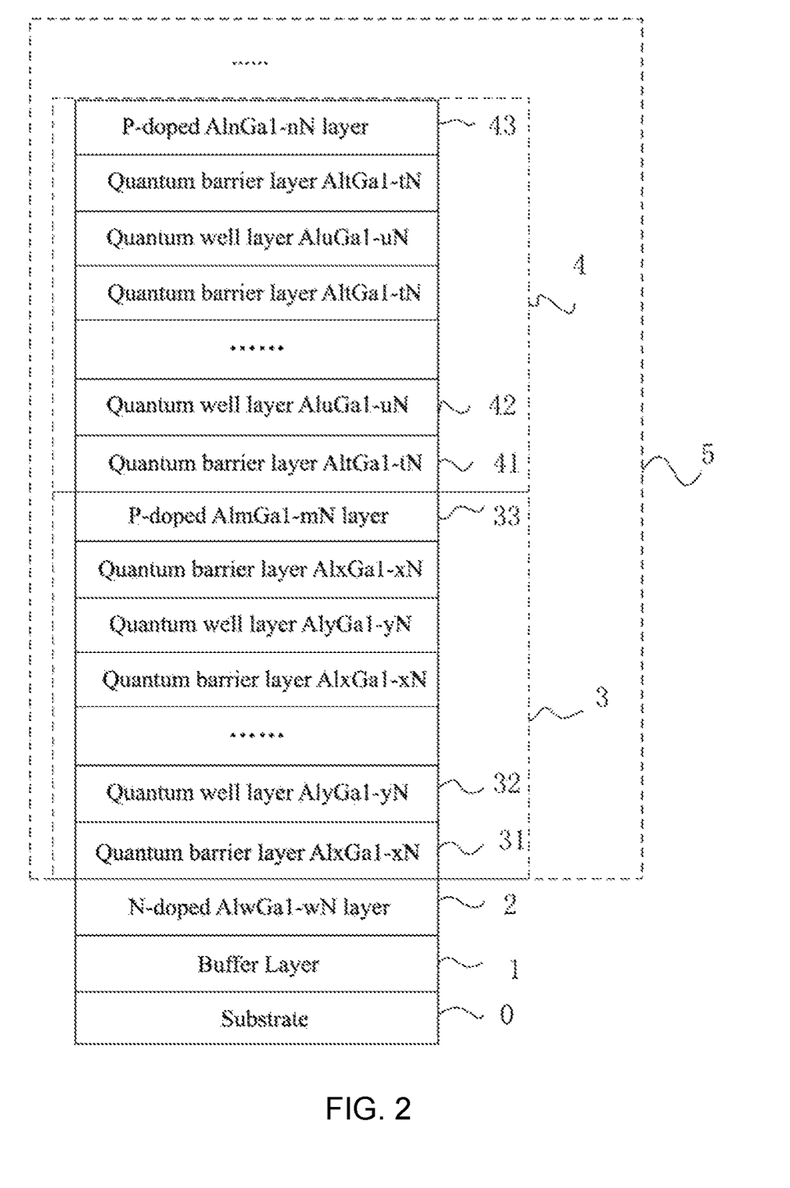
FIG. 2 is a schematic diagram of an ultraviolet LED epitaxial structure according to Embodiment I of the present disclosure.

FIG. 1 is a flowchart of an ultraviolet LED epitaxial production method according to Embodiment I. FIG. 2 is schematic diagram of an ultraviolet LED epitaxial structure according to Embodiment I. As shown in FIG. 1 and FIG. 2, the method according to this embodiment may include:

Step S101: pre-introducing a metal source and a group-V reactant on a substrate, to form a buffer layer through decomposition at a first temperature.

The substrate 0 is mainly used for support and for improving a property of a thin film. The thin film is grown on substrate 0, and the property of the thin film is highly influenced by a material property and a surface shape of the substrate 0. As the thin film generally has a thickness between nanometers and micrometers, high flatness of the surface of the substrate 0 is required. And the match between the thin film and the substrate 0 is also a very important aspect. A long transition region will be formed in an early stage of the film formation, if there is a lattice mismatch between the thin film and the substrate 0. Optionally, the substrate 0 is one of sapphire, Si, SiC, glass, Cu, Ni and Cr.

A generation device for the growth of the thin film on the substrate 0 is not limited in this embodiment. Optionally, the growth device may be any one of a metal-organic chemical vapor deposition (MOCVD) device, a molecular beam epitaxy (MBE) device, and a hydride vapor phase epitaxy (HYPE) device.

A growth process of a buffer layer 1 is as following: when a temperature of the surface of the material of the substrate 0 is raised to a first temperature (at this time, the first temperature is any temperature value in the range of 600° C. to 1000° C.), the metal source and NH3 are introduced for a reaction of 3 to 5 minutes, and the metal source and ammonia (NH3) decompose at this temperature and undergo a chemical reaction, so that an amorphous buffer growth layer is formed. A thickness of the buffer layer 1 is not limited in this embodiment. Optionally, the thickness of buffer layer 1 is in a range of 0 to 5000 nm. In addition, the material of the metal source is not limited in this embodiment. In an optional implementation, the metal source is an Aluminum metal source. The Aluminum metal source and NH3 are introduced, and they are decomposed and undergo a reaction to form the AlN buffer layer 1.

After the buffer layer is generated, the ultraviolet LED epitaxial production method according to this embodiment of the present disclosure may also include: the temperature of the reaction chamber is raised to 1200° C. to 1400° C., at this time, the buffer layer decomposes and recrystallizes, so that uniformly distributed nucleation islands are formed, and then, on this basis, a pressure is maintained at 50 mBar to 200 mBar, Trimethylaluminum (TMA1) and NH3 are introduced to grow and merge the nucleation islands, and an undoped AlN layer is formed without incorporation of any impurities, where the thickness of the layer is about 500 nm to 5000 nm.

Step S102: growing an N-doped AlwGa1-wN layer on the buffer layer at a second temperature.

The temperature in the reaction chamber is raised, to grow the N-type AlwGa1-wN layer 2 on the buffer layer 1, the second temperature may be any temperature between 1000° C. to 1300° C. During the growth process of the N-doped AlwGa1-wN layer 2, TMA1, Trimethylgallium (TMGa) and NH3 may be introduced at the same time to grow the AlwGa1-wN layer. An N-type impurity is doped during the growth process of the AlwGa1-wN to form the N-doped AlwGa1-wN. In this embodiment, the thickness range and the doping concentration of the N-doped AlwGa1-wN layer 2 are not specifically limited. Optionally, the thickness of the N-doped AlwGa1-wN layer 2 is in a range of 500 nm to 4000 nm, and the doping concentration of the N-doped AlwGa1-wN layer 2 is in a range of $1*10^{17}$ to $5*10^{19}$ per cubic centimeter ($cm^3$).

Step S103: growing a multi-section LED structure on the N-doped AlwGa1-wN layer at a third temperature, where a number of the sections of the multi-section LED structure is in a range of 2 to 50, each section of the LED structure includes an AlxGa1-xN/AlyGa1-yN multi-quantum well (MQW) structure and a P-type AlmGa1-mN layer, and the multi-section LED structure emits light of one or more wavelengths.

The multi-section LED structure 5 is grown, at the third temperature, on the N-doped AlwGa1-wN layer 2 that is well grown, where each section of the LED structure includes the AlxGa1-xN/AlyGa1-yN MQW and the P-type AlmGa1-mN layer 33.

For example, the quantum well layer is grown on the N-doped AlwGa1-wN layer 2, and the temperature of the reaction chamber is changed to the third temperature, where the third temperature may be any temperature of 1000° C. to 1300° C. At the third temperature, TMA1, TMGa and NH3 may be introduced at the same time to grow the AlxGa1-xN/AlyGa1-yN multi-quantum well structure. During the growth of the AlxGa1-xN/AlyGa1-yN multi-quantum well structure, first, one quantum barrier layer AlxGa1-xN 31 is grown on the N-doped AlwGa1-wN layer 2, and then a quantum well layer AlyGa1-yN 32 is grown on the quantum barrier layer, where in the AlxGa1-xN/AlyGa1-yN multi-quantum well structure, the Al content in the quantum barrier layer AlxGa1-xN 31 is higher than the Al content in the quantum well layer AlyGa1-yN 32.

One layer of the quantum barrier layer AlxGa1-xN 31 and one layer of the quantum well layer AlyGa1-yN 32 is one period of the multi-quantum well structure.

Optionally, in each section of the LED structure, the number of the periods of the AlxGa1-xN/AlyGa1-yN multi-quantum well structure is in the range of 2 to 50, and the thickness of a period of the AlxGa1-xN/AlyGa1-yN multi-quantum well structure is in the range of 5 nm to 30 nm, where the width of quantum well is 1 nm to 5 nm, and the width of the quantum barrier is 5 nm to 25 nm.

One more quantum barrier layer AlxGa1-xN 31 is grown on the AlxGa1-xN/AlyGa1-yN multi-quantum well structure, to complete the growth of the AlxGa1-xN/AlyGa1-yN multi-quantum well structure. Then, the TMA1, TMGa and NH3 are introduced at the same time, to grow an AlmGa1-mN layer. During the growth process of AlmGa1-mN, a P-type impurity is doped to form a P-doped AlmGa1-mN layer 33. The AlxGa1-xN/AlyGa1-yN multi-quantum well structure and the P-doped AlmGa1-mN layer 33 together form a first section LED structure 3. Because of the existence of the P-doped AlmGa1-mN layer 33, the first section LED structure 3 forms an internal PN junction structure, and light of a certain wavelength is emitted.

In order to distinguish the first section LED structure 3 and a second LED structure 4, a multi-quantum well structure in the second structure is represented by an AlxGa1-tN/AlyGa1-uN multi-quantum well structure, and the P-doped AlmGa1-mN layer 33 in the first LED structure 3 is represented by the P-doped AlmGa1-nN layer 43.

The temperature of the reaction chamber is adjusted, and TMA1, TMGa and NH3 are introduced at the same time, to further grow an AltGa1-tN/AluGa1-uN multi-quantum well structure on the first section LED structure 3, where the period of the multi-quantum well structure is not limited herein, and the Al content of the quantum barrier layer AltGa1-tN 41 is higher than the Al content of the quantum well layer AluGa1-uN 42. After the AltGa1-tN/AluGa1-uN multi-quantum well structure is well grown, TMA1, TMGa and NH3 are introduced at the same time to grow an AlnGa1-nN layer. During the growth process of the AlnGa1-nN, a P-type impurity is doped to form a P-doped AlnGa1-nN layer 43, so that a second LED structure 4 is formed. Because of the existence of the P-doped AlnGa1-nN layer 43, the second section LED structure forms an internal PN junction structure, and light of a certain wavelength is emitted.

The Al content in the AltGa1-tN/AluGa1-uN multi-quantum well structure and the P-doped AlnGa1-nN layer 43 in the second section LED structure may be same as or different from the Al content in the AlxGa1-xN/AlyGa1-yN multi-quantum well structure and the P-doped AlmGa1-mN layer 33 in the first section LED structure. When the Al content in the AltGa1-tN/AluGa1-uN multi-quantum well structure and the P-doped AlnGa1-nN layer 43 in the second section LED structure is different from the Al content in the AlxGa1-xN/AlyGa1-yN multi-quantum well structure and the P-doped AlmGa1-mN layer 33 in the first section LED structure, that is, when x is not equal to t and y is not equal to u, the second section LED structure and the first layer LED structure emit light of different wavelengths. When the Al content in the AltGa1-tN/AluGa1-uN multi-quantum well structure and the P-doped AlnGa1-nN layer 43 in the second section LED structure is same as the Al content in the AlxGa1-xN/AlyGa1-yN multi-quantum well structure and the P-doped AlmGa1-mN layer 33 in the first section LED structure, that is, x is equal to t and y is equal to u, the second layer LED structure and the first LED structure emit light of a same wavelength.

A third section LED structure, a fourth section LED structure and so on may also be grown on the second section LED structure 4, to form a multi-section LED structure 5. The number of the sections of the LED structure is in the range of 2 to 50. The multi-section LED structure 5 may emit light of different wavelengths or may emit light of a same wavelength. The multi-section LED structure with different multi-quantum wells may form an ultraviolet LED with different sections having different luminescence spectra, where the different luminescence spectra may cover every waveband from 200 nm to 365 nm, implementing different ultraviolet LED functions.

In the multi-section LED structure, because of the existence of the P-doped AlGaN layer, an internal PN junction structure is formed in each LED structure, which emits light of a certain wavelength. The multi-section LED structure can solve the defect that the hole mobility is low and the hole cannot jump into a front quantum well for radiative recombination, thereby improving the utilization efficiency of the quantum well. Besides, because of the existence of the P-type AlGaN layer in each section, the antistatic capability of the ultraviolet LED device can be further enhanced. In addition, since the AlN layer has many defects and is likely to extend, a large number of non-radiative recombination centers are generated in the quantum well, and the P-type AlGaN layer exists in each section, which can prevent a dislocation from being transferred to the quantum well of the next layer, so that the non-radiative recombination centers are greatly reduced, further improving the luminous efficiency.

In this embodiment, the thickness range and the doping concentration of the P-doped AlmGa1-mN layer 33 are not limited. In a possible embodiment, the thickness of the P-doped AlmGa1-mN layer 33 is in the range of 5 nm to 100 nm, and the doping concentration of the P-doped AlmGa1-mN layer 33 is in the range of $1*10^{17}$ to $1*10^{20}$ cm$^{-3}$.

In order to improve the luminescence efficiency, optionally, in each section of the LED structure, the Al content of the P-doped AlmGa1-mN layer 33 is higher than the Al content of the quantum well layer AlyGa1-yN 32; the Al content of the N-doped AlwGa1-wN layer 2 is higher than the Al content of the quantum well layer AlyGa1-yN 32 in each section of the LED structure.

In the ultraviolet LED epitaxial production method according to this embodiment of the present disclosure, the metal source and the group-V element are introduced to form the buffer layer through decomposition at the first temperature, then the N-doped AlwGa1-wN layer is grown on the buffer layer at the second temperature, and finally the multi-section LED structure is grown on the N-doped AlwGa1-wN layer at the third temperature, where the number of the sections of the multi-section LED structure is in the range of 2 to 50. Each section of the LED structure includes the AlxGa1-xN/AlyGa1-yN multi-quantum well structure and the P-doped AlmGa1-mN layer, and the multi-section LED structure emits light of one or more wavelengths. Since the multi-section LED structure is grown on the N-doped AlwGa1-wN layer at the third temperature, and each section of the LED structure includes the AlxGa1-xN/AlyGa1-yN multi-quantum structure and the P-doped AlmGa1-mN layer, which realizes that a single ultraviolet LED emits ultraviolet light of different wavelengths, thereby further implementing different ultraviolet LED functions and improving the luminous efficiency of the ultraviolet LED.

Embodiment II

Figure 3:
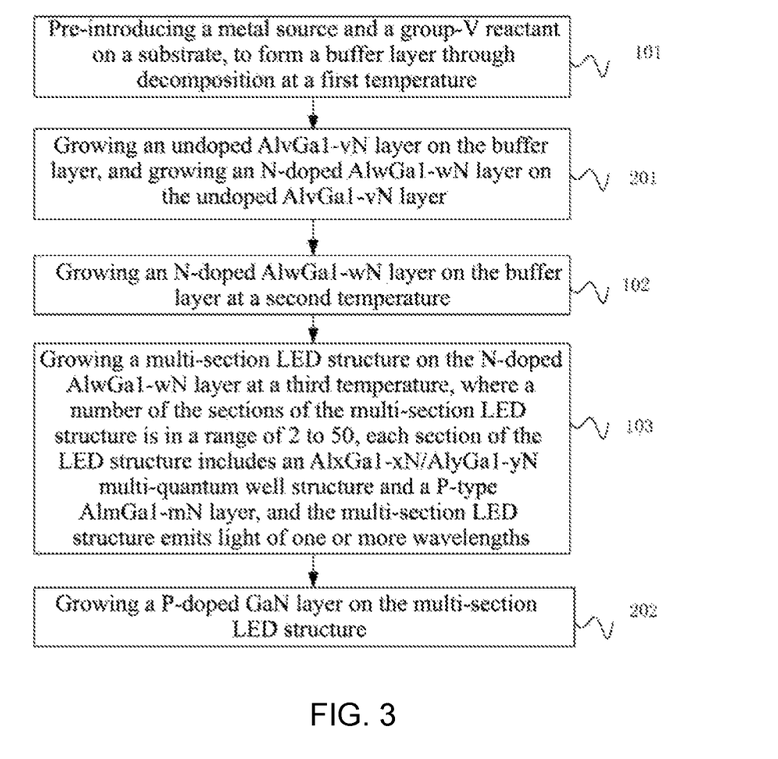
FIG. 3 is a flowchart of an ultraviolet LED epitaxial production method according to Embodiment II of the present disclosure.
Figure 4:
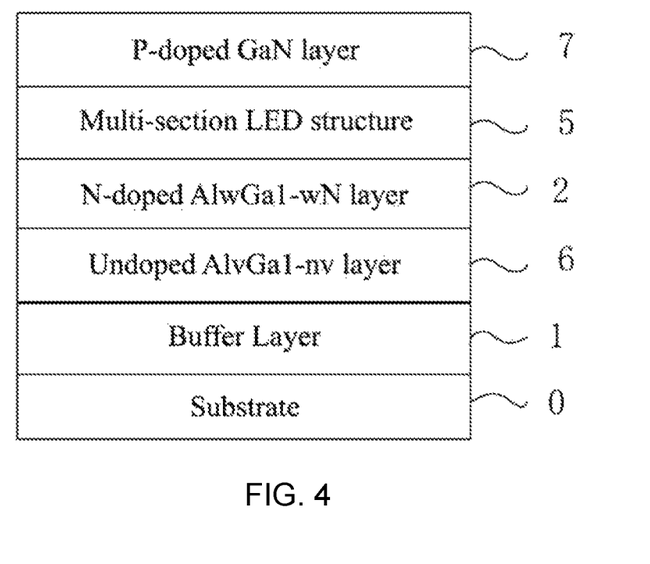
FIG. 4 is a schematic diagram of an ultraviolet LED epitaxial structure according to Embodiment III of the present disclosure.

On the basis of the above Embodiment I, in order to ensure the quality of the N-doped AlwGa1-wN layer, FIG. 3 is schematic flowchart of an ultraviolet LED epitaxial production method according to Embodiment II of the present disclosure, FIG. 4 is a schematic diagram of an ultraviolet LED epitaxial structure according to Embodiment III of the present disclosure, as shown in FIG. 3 and FIG. 4, the ultraviolet LED epitaxial production method according to this embodiment may further include:

Step S201: growing an undoped AlvGa1-vN layer on the buffer layer, and growing an N-doped AlwGa1-wN layer on the undoped AlvGa1-vN layer.

Specifically, the temperature of the reaction chamber is adjusted, and TMAl, TMGa and NH3 are introduced at the same time, to grow the undoped AlvGa1-vN layer 6, and then the N-doped AlwGa1-wN layer 2 is grown on the undoped AlvGa1-vN 6. In this embodiment, the Al content of the undoped AlvGa1-vN layer 6 is not limited. Optionally, the Al content of the undoped AlvGa1-vN 6 is higher than the Al content of the quantum well layer AlyGa1-yN 32 in each section of the LED structure.

In order to provide enough holes, the ultraviolet LED epitaxial production method according to this embodiment may further include:

Step S202: growing a P-doped GaN layer on the multi-section LED structure.

The P-doped GaN layer 7 is grown on the multi-section LED structure 5, where the thickness of the P-doped GaN layer 7 is in the range of 0 to 500 nm, and the doping concentration of the P-doped GaN layer 7 is in the range of $1\times10^{17}$ to $1\times10^{20}$ cm$^{-3}$. When the thickness of the P-doped GaN layer 7 is 0, the holes of the whole ultraviolet LED epitaxial structure are provided by the P-type AlGaN.

In ultraviolet LED epitaxial production method according to this embodiment, the undoped AlvGa1-vN layer is grown on the buffer layer, and the N-doped AlwGa1-wN is grown on the undoped AlvGa1-vN layer, which improves the quality of the N-doped AlwGa1-wN layer, thereby further improving the luminous efficiency of the ultraviolet LED, and since the P-doped GaN layer is grown on the multi-section LED structure, sufficient holes are provided for the LED structure and the antistatic ability can be enhanced.

Embodiment III

The ultraviolet LED can be used in the field of sterilization. In order to realize the production of the ultraviolet LED having the ultra-high sterilization function, on the basis of the above Embodiment I and Embodiment II, taking the production method of a three-section ultraviolet LED with an ultraviolet waveband of 280 nm as an example for illustration. The production method of an ultraviolet LED with a single wavelength of 280 nm may include the following steps:

First step: the temperature of the chamber of the metal organic chemical vapor deposition device (MOVCD) is raised to 900° C., the pressure is set at 400 mbar, TMA1 (150 ml/min) and NH3 are introduced for 3 minutes, and a reaction occurs on a sapphire substrate to form an AlN buffer layer of 25 nm.

Second step: the temperature is raised to 1200° C., the pressure is reduced to 200 mbar, a decomposion reaction of the AlN buffer layer occurs, and after the AlN buffer layer was decomposed, it is diffused and migrated on the surface of the substrate and forms nucleation islands.

Third step: the temperature is raised to 1250° C., the pressure is maintained at 200 mbar, H2, TMA1 (200 ml/min) and NH3 are introduced for 80 minutes, an AlN crystal nucleus is formed at the bottom of a gold particle and grows bigger to form an AlN layered structure.

Fourth step: the temperature is reduced to 1150° C., the pressure is maintained at 200 mbar, H2, TMGa (100 ml/min), TMA1 (00 ml/min) and NH3 are introduced for 80 minutes, to form one undoped AlGaN layer.

Fifth step: the temperature is reduced to 1150° C., the pressure is maintained at 200 mbar, H2, TMGa (100 ml/min), TMA1 (360 ml/min) and NH3 are introduced for 80 minutes, and SiH4 is doped. One layer of N-type AlGaN layer with a thickness of 1500 nm is formed, where the Al composition of the AlGaN is 52%, and the doping concentration of the N-type AlGaN is $1\times10^{19}$ cm$^{-1}$.

Sixth step: the temperature is maintained at 1150° C., the pressure is maintained at 200 mbar, H2, TMA1 (200 ml/min) and NH3 are introduced, to form an AlGaN quantum barrier, where the Al composition of the AlGaN is 58%, and a Si impurity is doped, where the doping concentration is $1\times10^{18}$ cm$^{-3}$. The growth time length is 1 min, and the thickness is 12 nm.

Seventh step: the temperature is maintained at 1150° C., the pressure is adjusted to 200 mbar, H2, TMGa (50 ml/min), TMA1 (50 ml/min) and NH3 are introduced, to form an AlGaN quantum barrier, where the Al composition of the AlGaN is 35%, the growth time length is 30 s, and the thickness is 3 nm.

Eighth step: the sixth step to the seventh step is repeated for 8 cycles to form quantum well structures of 8 periods.

Ninth step: the temperature is maintained at 1150° C., the pressure is adjusted to 200 mbar, H2, TMGa (50 ml/min), TMA1 (200 ml/min) and NH3 are introduced, to form an AlGaN quantum well, where the Al composition of the AlGaN is 58%. The last layer of quantum barrier layer is grown, where the growth time length is 1 minute, and the thickness is 12 nm.

Tenth step: the temperature is maintained at 1150° C., the pressure is adjusted to 200 mbar, H2, TMGa (50 ml/min), TMA1 (250 ml/min) and NH3 are introduced, to form an AlGaN electron block layer, where the Al composition of the AlGaN is 65%. An Mg impurity is doped, of which the doping concentration is $1\times10^{19}$ cm$^{-3}$, and a P-doped AlGalN layer is formed, where the growth time length is 2 minutes, and the thickness is 30 nm.

Through the sixth step to the tenth step, a single-section LED structure with a single waveband of 280 nm is formed.

Eleventh step: the sixth step to the tenth step is repeated for 3 cycles to form a three-section ultraviolet LED structure with a single waveband of 280 nm.

Through the eleventh step, the generation of the three-section LED structure with a single waveband 280 nm is implemented, a multi-section ultraviolet LED structure with a single waveband of 280 nm can be generated by adjusting the cycle times of repeating the sixth step to the tenth step, and which is not limited in this embodiment of the present disclosure.

Twelfth step: the temperature is reduced to 900° C., the pressure is adjusted to 200 mbar, H2, TEGa (360 ml/min) and NH3 are introduced, an Mg impurity is doped, of which the doping concentration is $1\times10^{19}$ cm$^{-3}$. A P-type GaN layer is grown, where the growth time length is 30 minutes, the thickness is 300 nm.

Thirteenth step: the three-section LED is annealed and is chip-processed into a chip with a size of 1 mm$^2$, to which a current of 350 mA is applied. The wavelength is 280 nm, the brightness is 100 mW, the external quantum efficiency is close to 95%, and the forward voltage is 6.5 V.

In this embodiment of the present disclosure, the production of the three-section ultraviolet LED with a waveband of 280 nm is implemented, which has an ultra-high sterilization efficiency.

Embodiment IV

The ultraviolet LED may be applied to the field of phototherapy. In order to realize the production of ultraviolet LED with a good phototherapy effect. On the basis of the above embodiments, taking the production method of a five-section ultraviolet LED with an ultraviolet waveband of 310 nm as an example for illustration. The production method of an ultraviolet LED with a single wavelength of 310 nm may include the following steps:

First step: the reaction chamber of the MOCVD is raised to 950° C., the pressure is set at 400 mbar, TMA1 (150 ml/min) and NH3 are introduced for 3 minutes at the same time, and a reaction occurs on a sapphire substrate to form an AlN buffer layer of 25 nm.

Second step: the temperature is raised to 1200° C., the pressure is reduced to 200 mbar, a decomposion reaction of the AlN buffer layer occurs, and after the AlN buffer layer was decomposed, it is diffused and migrated on the surface of the substrate and forms nucleation islands.

Third step: the temperature is raised to 1280° C., the pressure is maintained at 200 mbar, H2, TMA1 (400 ml/min) and NH3 are introduced for 60 minutes, an AlN crystal nucleus is formed at the bottom of a gold particle and grows bigger to form an AlN layered structure.

Fourth step: the temperature is reduced to 1100° C., the pressure is maintained at 200 mbar, H2, TMGa (100 ml/min), TMA1 (360 ml/min) and NH3 are introduced for 70 minutes, and SiH4 is doped. One layer of N-type AlGaN layer with a thickness of 1500 nm is formed, where the Al composition of the AlGaN is 44%, and the doping concentration of the N-type AlGaN is $1\times10^{19}$ cm$^{-3}$.

Fifth step: the temperature is maintained at 1100° C., the pressure is adjusted to 200 mbar, H2, TMGa (50 ml/min), TMA1 (200 ml/min) and NH3 are introduced, to form an AlGaN quantum barrier, where the Al composition of the AlGaN is 50%, a Si impurity, of which the doping concentration is $1\times10^{18}$ cm$^{-3}$, is doped, the growth time length is 50 seconds, and the thickness is 12 nm.

Sixth step: the temperature is maintained at 1100° C., the pressure is adjusted to 200 mbar, H2, TMGa (50 ml/min), TMA1 (50 ml/min) and NH3 are introduced, to form an AlGaN quantum barrier, where the Al composition of the AlGaN is 25%, the growth time length is 30 s, and the thickness is 2.5 nm.

Seventh step: the fifth step to the sixth step is repeated for 5 cycles to form quantum well structures of 5 periods.

Eighth step: the temperature is maintained at 1100° C., the pressure is adjusted to 200 mbar, H2, TMGa (50 ml/min), TMA1 (200 ml/min) and NH3 are introduced, to form an AlGaN quantum barrier, where, for growing the last layer of quantum barrier, the Al composition of the AlGaN is 50%, the growth time length is 50 s, the thickness is 12 nm.

Ninth step: the temperature is maintained at 1100° C., the pressure is adjusted to 200 mbar, H2, TMGa (50 ml/min), TMA1 (250 ml/min) and NH3 are introduced, to form an AlGaN electron block layer, where the Al composition of the AlGaN is 53%. An Mg impurity is doped, of which the doping concentration is $1 \times 10^{19}$ cm$^{-3}$. A P-doped AlGaN layer is formed, where the growth time is 2 min, and the thickness is 30 nm.

Tenth step: the fifth step to the ninth step is repeated for 5 cycles to form a five-section ultraviolet LED structure with a single waveband of 310 nm.

Through the fifth step to the eleventh step, the generation of a five-section LED structure with a single waveband 310 nm is implemented, a multi-section ultraviolet LED structure with a single waveband of 310 nm can be generated by adjusting the cycle times of repeating the fifth step to the ninth step, which is not limited in this embodiment.

Eleventh step: the temperature is reduced to 900° C., the pressure is adjusted to 200 mbar, hydrogen (H2), Triethylgallium (TEGa) (360 ml/min) and NH3 are introduced, an Mg impurity is doped, where the doping concentration of the Mg is $1 \times 10^{19}$ cm$^{-3}$. The growth time length is 5 minutes, and it is a P-type GaN layer, where the thickness is 50 nm.

Twelfth step: the five-section LED is annealed and is chip-processed into a chip with a size of 1 mm$^2$, to which a current of 350 mA is applied. The wavelength is 310 nm, the brightness is 100 mW, the external quantum efficiency is close to 5%, and the forward voltage is 6.0 V.

In this embodiment of the present disclosure, the production of the ultraviolet LED with a waveband of 310 nm is implemented, which has a good phototherapy effect.

Embodiment V

The ultraviolet LED can also be used in the field of photocuring. In order to realize the production of the ultraviolet LED with a photocuring function, based on the above embodiments, in the following, a production method of a six-section ultraviolet LED with a single wavelength of 350 nm is introduced, the production method of the six-section ultraviolet LED with a wavelength of 350 nm may include the following steps:

First step: the reaction chamber of the MOCVD is raised to 850° C., the pressure is set at 400 mbar, TMA1 (150 ml/min) and NH3 are introduced for 3 minutes at the same time, and a reaction occurs on a sapphire substrate to form an AlN buffer layer of 25 nm.

Second step: the temperature is raised to 1280° C., pressure is reduced to 200 mbar, a decomposition reaction of the AlN buffer layer occurs, and after the AlN buffer layer was decomposed, it is diffused and migrated on the surface of the substrate and forms nucleation islands.

Third step: the temperature is raised to 1280° C., the pressure is maintained at 200 mbar, H2, TMA1 (500 ml/min) and NH3 are introduced for 60 minutes, an AlN crystal nucleus is formed at the bottom of a gold particle and grows bigger to form an AlN layered structure.

Fourth step: the temperature is reduced to 1050° C., the pressure is maintained at 200 mbar, H2, TMGa (100 ml/min), TMA1 (360 ml/min) and NH3 are introduced for 60 minutes, and SiH4 is doped. One layer of N-type AlGaN layer with a thickness of 1500 nm is formed, where the Al composition of the AlGaN is 38%, and the doping concentration of the N-type AlGaN is $1 \times 10^{19}$ cm$^{-3}$.

Fifth step: the temperature is maintained at 1050° C., the pressure is maintained at 200 mbar, H2, TMGa (50 ml/min), TMA1 (200 ml/min) and NH3 are introduced, to form an AlGaN quantum barrier, where the Al composition of the AlGaN is 42%, and a Si impurity, of which the doping concentration is $1 \times 10^{18}$ cm$^{-3}$, is doped, the growth time length is 50 seconds, and the thickness is 15 nm.

Sixth step: the temperature is maintained at 1050° C., the pressure is adjusted to 200 mbar, H2, TMGa (80 ml/min), TMA1 (50 ml/min) and NH3 are introduced, to form an AlGaN quantum barrier, where the Al composition of the AlGaN is 10%, the growth time length is 20 s, and the thickness is 3 nm.

Seventh step: the fifth step to the sixth step is repeated for 10 cycles to form quantum well structures of 10 periods.

Eighth step: the temperature is maintained at 1050° C., the pressure is adjusted to 200 mbar, H2, TMGa (50 ml/min), TMA1 (200 ml/min) and NH3 are introduced, to form an AlGaN quantum barrier, where the Al composition of the AlGaN is 42%. For growing the last layer of quantum barrier layer, the growth time length is 1 min, and the thickness is 12 nm.

Ninth step: the temperature is maintained at 1050° C., the pressure is maintained at 200 mbar, H2, TMGa (50 ml/min), TMA1 (200 ml/min) and NH3 are introduced, to form an AlGaN quantum barrier layer, where the Al composition of the AlGaN is 45%, and a Mgi impurity is doped, of which the doping concentration is $10^{19}$ cm$^{-3}$. A P-doped AlGaN layer is formed, where the growth time length is 1 min, and the thickness is 15 nm.

Tenth step: the fifth step to the ninth step is repeated for 6 cycles to form a six-section ultraviolet LED structure with a single waveband of 350 nm.

Through the fifth step to the tenth step, the generation of the sixe-section LED structure with a single waveband 350 nm is implemented, a multi-section ultraviolet LED structure with a single waveband of 350 nm can be generated by adjusting the cycle times of repeating the fifth step to the ninth step, which is not limited in this embodiment of the present disclosure.

Eleventh step: the temperature is reduced to 950° C., the pressure is adjusted to 200 mbar, H2, TEGa (360 ml/min) and NH3 are introduced, an Mg impurity is doped, of which the doping concentration is $1 \times 10^{19}$ cm$^{-3}$. A P-type GaN layer is grown, where the growth time length is 20 minutes, and the thickness is 200 nm.

Twelfth step: the six-section LED is annealed and is chip-processed into a chip with a size of 1 mm$^2$, to which a current of 350 mA is applied. The wavelength is 350 nm, the brightness is 150 mW, the brightness is 150 mW, and the forward voltage is 5.5V.

In this embodiment of the present disclosure, the production of the ultraviolet LED with a waveband of 350 nm is implemented, which has a very efficient photocuring effect.

Embodiment VI

In order to realize the production of an ultraviolet LED having the functions of sterilization, phototherapy and light curing, on the basis of the above embodiments, this embodiment of the present disclosure provides a production method of a two-section ultraviolet LED with different wavelengths (280 nm+310 nm), which may include the following steps:

First step: the reaction chamber of the MOCVD is raised to 900° C., the pressure is set at 400 mbar, TMA1 (150 ml/min) and NH3 are introduced for 3 minutes at the same time, and a reaction occurs on a sapphire substrate to form an AlN buffer layer of 25 nm.

Second step: the temperature is raised to 1200° C., the pressure is reduced to 200 mbar, a decompostion reaction of the AlN buffer layer occurs, and after the AlN buffer layer was decomposed, it is diffused and migrated on the surface of the substrate and forms nucleation islands.

Third step: the temperature is raised to 1250° C., the pressure is maintained at 200 mbar, H2, TMA1 (200 ml/min) and NH3 are introduced for 80 minutes, an AlN crystal nucleus is formed at the bottom of a gold particle and grows bigger to form an AlN layered structure.

Fourth step: the temperature is reduced to 1150° C., the pressure is maintained at 200 mbar, H2, TMA1 (200 ml/min) and NH3 are introduced for 80 minutes, and SiH4 is doped. A layer of N-type AlGaN layer with a thickness of 1500 nm is formed, where the Al composition of the AlGaN is 52%, and the doping concentration of the N-type AlGaN is $1 \times 10^{19}$ $cm^{-3}$.

Fifth step: the temperature is maintained at 1150° C., the pressure is maintained at 200 mbar, H2, TMA1 (200 ml/min) and NH3 are introduced, to form an AlGaN quantum barrier, where the Al composition of the AlGaN is 58%, and a Si impurity is doped, where the doping concentration is $1 \times 10^{18}$ $cm^{-3}$. The growth time length is 50 seconds, and the thickness is 12 nm.

Sixth step: the temperature is maintained at 1150° C., the pressure is adjusted to 200 mbar, TMG, TMA1 (50 ml/min) and NH3 are introduced, to form an AlGaN quantum barrier, where the Al composition of the AlGaN is 35%, The growth time length is 30 seconds, and the thickness is 3 nm.

Seventh step: the fifth step to the sixth step are repeated for 5 cycles to form quantum well structures of 5 periods.

Eighth step: the temperature is maintained at 1150° C., the pressure is maintained at 200 mbar, H2, TMGa (50 ml/min), TMA1 (200 ml/min) and NH3 are introduced, to grow an AlGaN quantum barrier, where the Al composition of the AlGaN is 58%. The last layer of quantum barrier layer is grown, where the growth time length is 1 minute, and the thickness is 12 nm.

Ninth step: the temperature is maintained at 1150° C., the pressure is adjusted to 200 mbar, H2, TMGa (50 ml/min), TMA1 (250 ml/min) and NH3 are introduced, to grow an AlGaN electron block layer, where the Al composition of the AlGaN is 65%. An Mg impurity is doped, of which the doping concentration of Mg is $1 \times 10^{19}$ $cm^{-3}$. A first section electron block layer, that is, a P-doped AlGaN layer, is grown, where the growth time length is 2 min, and the thickness is 30 nm.

Through the above steps, the production of the single-section ultraviolet LED structure with a wavelength of 280 nm is implemented, on this basis, continuously, an ultraviolet LED structure with a wavelength of 310 nm may be grown, the steps are as following:

Tenth step: the temperature is maintained at 1100° C., the pressure is maintained at 200 mbar, H2, TMGa (50 ml/min), TMA1 (200 ml/min) and NH3 are introduced, to grow an AlGaN quantum barrier, where the Al composition of the AlGaN is 50%, and a Si impurity is doped, where the doping concentration is $1 \times 10^{18}$ $cm^{-3}$. The growth time length is 50 s, and the thickness is 12 nm.

Eleventh step: the temperature is maintained at 1100° C., the pressure is adjusted to 200 mbar, H2, TMGa (50 ml/min), TMA1 (50 ml/min) and NH3 are introduced, to grow an AlGaN quantum barrier, where the Al composition of the AlGaN is 25%, The growth time length is 20 s and the thickness is 2.5 nm.

Twelfth step: the tenth step to the eleventh step is repeated for 6 cycles to form quantum well structures of 6 periods.

Thirteenth step: the temperature is maintained at 1100° C., the pressure is adjusted to 200 mbar, H2, TMGa (50 ml/min), TMA1 (200 ml/min) and NH3 are introduced, to grow an AlGaN quantum well, where the Al composition of the AlGaN is 50%. The last layer of quantum barrier layer is grown, where the growth time length is 50 s, and the thickness is 12 nm.

Fourteenth step: the temperature is maintained at 1100° C., the pressure is maintained at 200 mbar, H2, TMGa (50 ml/min), TMA1 (250 ml/min) and NH3 are introduced, to grow an AlGaN quantum barrier layer, where the Al composition of the AlGaN is 53%, and an Mg impurity is doped, where the doping concentration of Mg is $1 \times 10^{19}$ $cm^{-3}$. A second section electron block layer, that is, a P-doped AlGaN layer, is grown, where the growth time length is 2 min, and the thickness is 30 nm.

Through the tenth step to the fourteenth step, the production of the second section LED structure is implemented, which can emit ultraviolet light of a wavelength of 310 nm.

Fifteenth step: the temperature is reduced to 900° C., the pressure is adjusted to 200 mbar, H2, TEGa (360 ml/min) and NH3 are introduced, an Mg impurity is doped, of which the doping concentration is $1 \times 10^{19}$ $cm^{-3}$. A P-type GaN layer is grown, the growth time length is 20 minutes, and the thickness is 200 nm.

Sixteenth step: the two-section LED is annealed and is chip-processed into a chip with a size of 1 $mm^2$, to which a current of 350 mA is applied. The wavelength includes two wavebands of 280 nm and 350 nm, the brightness is 100 mW, and the forward voltage is 6.5V.

In this embodiment of the present disclosure, the production of the ultraviolet LED with two different wavelengths (280 nm+350 nm) is implemented, which has both sterilization and phototherapy functions.

Embodiment VII

In order to improve the sterilization and phototherapy functions of the ultraviolet LED, in this embodiment, on the basis of the above embodiments, a multi-section ultraviolet LED with different wavelengths (208 nm+310 nm) may further be produced, where the production steps may include:

First step: the reaction chamber of the MOCVD is raised to 900° C., the pressure is set at 400 mbar, TMA1 (150 ml/min) and NH3 are introduced for 3 minutes at the same time, and a reaction occurs on a sapphire substrate to form an AlN buffer layer of 25 nm.

Second step: the temperature is raised to 1200° C., the pressure is reduced to 200 mbar, a decompostion reaction of the AlN buffer layer occurs, and after the AlN buffer layer was decomposed, it is diffused and migrated on the surface of the substrate and forms nucleation islands.

Third step: the temperature is raised to 1250° C., the pressure is maintained at 200 mbar, H2, TMA1 (200 ml/min) and NH3 are introduced for 80 minutes, an AlN crystal nucleus is formed at the bottom of a gold particle and grows bigger to form an AlN layered structure.

Fourth step: the temperature is reduced to 1150° C., the pressure is maintained at 200 mbar, H2, TMA1 (200 ml/min) and NH3 are introduced for 80 minutes, and SiH4 is doped. A layer of N-type AlGaN layer with a thickness of 1500 nm is formed, where the Al composition of the AlGaN is 52%, and the doping concentration of the N-type AlGaN is $1\times10^{19}$ $cm^{-3}$.

Fifth step: the temperature is maintained at 1150° C., the pressure is maintained at 200 mbar, H2, TMGa (50 ml/min), TMA1 (200 ml/min) and NH3 are introduced, to form an AlGaN quantum barrier, where the Al composition of the AlGaN is 58%, and a Si impurity, of which the doping concentration is $1\times10^{18}$ $cm^{-3}$, is doped, the growth time length is 50 s, and the thickness is 12 nm.

Sixth step: the temperature is maintained at 1150° C., the pressure is adjusted to 200 mbar, H2, TMGa (50 ml/min), TMA1 (50 ml/min) and NH3 are introduced, to form an AlGaN quantum barrier, where the Al composition of the AlGaN is 35%, the growth time length is 30 s, and the thickness is 3 nm.

Seventh step: the fifth step to the sixth step is repeated for 5 cycles to form quantum well structures of 5 periods.

Eighth step: the temperature is maintained at 1150° C., the pressure is adjusted to 200 mbar, H2, TMGa (50 ml/min), TMA1 (200 ml/min) and NH3 are introduced, to grow an AlGaN quantum barrier, where the Al composition of the AlGaN is 58%. The last layer of quantum barrier layer is grown, where the growth time length is 1 min, and the thickness is 12 nm.

Ninth step: the temperature is maintained at 1150° C., the pressure is maintained at 200 mbar, H2, TMGa (50 ml/min), TMA1 (200 ml/min) and NH3 are introduced, to grow an AlGaN quantum barrier layer, where the Al composition of the AlGaN is 65%, and an Mg impurity, of which the doping concentration of Mg is $1\times10^{19}$ $cm^{-3}$. A P-doped AlGaN layer is grown, where the growth time length is 2 min, and the thickness is 30 nm.

Tenth step: the fifth step to the ninth step is repeated for 3 cycles to first form a three-section LED structure with a waveband of 280 nm.

Through the fifth step to the tenth step, a three-section ultraviolet LED structure with a wavelength of 280 nm is formed, which improves the luminous intensity and enhances the sterilization effect. The forming the three-section ultraviolet LED structure with a waveband of 280 nm includes:

Eleventh step: the temperature is maintained at 1100° C., the pressure is maintained at 200 mbar, H2, TMGa (50 ml/min), TMA1 (200 ml/min) and NH3 are introduced, to form an AlGaN quantum barrier, where the Al composition of the AlGaN is 50%, and a Si impurity is doped, of which the doping concentration is $1\times10^{18}$ $cm^{-3}$, the growth time length is 50 s, and the thickness is 12 nm.

Twelfth step: the temperature is maintained at 1100° C., the pressure is adjusted to 200 mbar, H2, TMGa (50 ml/min), TMA1 (50 ml/min) and NH3 are introduced, to grow an AlGaN quantum barrier, where the Al composition of the AlGaN is 25%, the growth time length is 20 s, and the thickness is 2.5 nm.

Thirteenth step: the tenth step to the twelfth step is repeated for 6 cycles to form quantum well structures 310 nm of 6 periods.

Fourth step: the temperature is maintained at 1100° C., the pressure is adjusted to 200 mbar, H2, TMGa (50 ml/min), TMA1 (200 ml/min) and NH3 are introduced, to grow an AlGaN quantum well, where the Al composition of the AlGaN is 50%. For growing the last layer of quantum barrier layer, where the growth time length is 50 s, and the thickness is 12 nm.

Fifteenth step: the temperature is maintained at 1100° C., the pressure is adjusted to 200 mbar, H2, TMGa (50 ml/min), TMA1 (250 ml/min) and NH3 are introduced, to grow an AlGaN electron block layer, where the Al composition of the AlGaN is 53%. An Mg impurity is doped, of which the doping concentration is $1\times10^{19}$ $cm^{-3}$. A P-doped AlGaN layer is formed, where the growth time length is 2 min, and the thickness is 30 nm.

Sixteenth step: the eleventh step to the fifteenth step is repeated for 4 cycles to form a four-section LED structure with a waveband of 310 nm.

Through the eleventh step to the sixteenth step, a four-section ultraviolet LED structure with a waveband of 310 nm is formed, which improves the luminous intensity and enhances the phototherapy function.

Seventeenth step: the temperature is reduced to 900° C., the pressure is adjusted to 200 mbar, H2, TEGa (360 ml/min) and NH3 are introduced, an Mg impurity is doped, of which the doping concentration is $1\times10^{19}$ $cm^{-3}$. A P-type GaN layer is grown, the growth time length is 40 min, and the thickness is 400 nm.

Eighteenth step: the multi-section LED is annealed and is chip-processed into a chip with a size of 1 $mm^2$, to which a current of 350 mA is applied. The wavelength includes two wavebands of 280 nm and 350 nm, the brightness is 180 mW, the brightness is 180 mW, and the forward voltage is 6.5V.

The multi-section ultraviolet LED with multiple wavebands produced according to the embodiment of the disclosure has a high efficiency sterilization function and a phototherapy function at the same time.

Embodiment VIII

In order to realize the production of the multi-section ultraviolet LED with multiple-wavebands having the functions of sterilization, phototherapy and light curing, on the basis of the above embodiments, in this embodiment of the present disclosure, a three-section ultraviolet LED with different wavelengths (280 bm+310 nm+350 nm) is produced, including:

First step: the reaction chamber of the MOCVD is raised to 950° C., the pressure is set at 400 mbar, TMA1 (150 ml/min) and NH3 are introduced for 3 minutes at the same time, and a reaction occurs on a sapphire substrate to form an AlN buffer layer of 25 nm.

Second step: the temperature is raised to 1200° C., the pressure is reduced to 200 mbar, a decomposion reaction of the AlN buffer layer occurs, and after the AlN buffer layer was decomposed, it is diffused and migrated on the surface of the substrate and forms nucleation islands.

Third step: the temperature is raised to 1250° C., the pressure is maintained at 200 mbar, H2, TMA1 (200 ml/min) and NH3 are introduced for 80 minutes, an AlN crystal nucleus is formed at the bottom of a gold particle and grows bigger to form an AlN layered structure.

Fourth step: the temperature is reduced to 1150° C., the pressure is maintained at 200 mbar, H2, TMGa (100 ml/min), TMA1 (360 ml/min) and NH3 are introduced for 80 minutes, and SiH4 is doped. A layer of N-type AlGaN layer with a thickness of 1500 nm is formed, where the Al composition of the AlGaN is 52%, and the doping concentration of the N-type AlGaN is $1\times10^{19}$ $cm^{-3}$.

Fifth step: the temperature is maintained at 1150° C., the pressure is maintained at 200 mbar, H2, TMGa (50 ml/min), TMA1 (200 ml/min) and NH3 are introduced, to grow an AlGaN quantum barrier, where the Al composition of the AlGaN is 58%, and a Si impurity is doped, of which the doping concentration is $1\times10^{18}$ cm$^{-3}$. The growth time length is 1 min, and the thickness is 12 nm.

Sixth step: the temperature is maintained at 1150° C., the pressure is adjusted to 200 mbar, H2, TMGa (50 ml/min), TMA1 (50 ml/min) and NH3 are introduced, to grow an AlGaN quantum barrier, where the Al composition of the AlGaN is 35%, The growth time length is 30 s, and the thickness is 3 nm.

Seventh step: the fifth step to the sixth step is repeated for 5 cycles to form quantum well structures of 5 periods.

Eighth step: the temperature is maintained at 1150° C., the pressure is adjusted to 200 mbar, H2, TMGa (50 ml/min), TMA1 (200 ml/min) and NH3 are introduced, to grow an AlGaN quantum well, where the Al composition of the AlGaN is 58%. The last layer of quantum barrier layer is grown, where the growth time length is 1 min, and the thickness is 12 nm.

Ninth step: the temperature is maintained at 1150° C., the pressure is adjusted to 200 mbar, H2, TMGa (50 ml/min), TMA1 (250 ml/min) and NH3 are introduced, to grow an AlGaN electron block layer, where the Al composition of the AlGaN is 65%. An Mg impurity is doped, of which the doping concentration of Mg is $1\times10^{19}$ cm$^{-3}$. A first section electron block layer is grown, where the growth time length is 2 min, and the thickness is 30 nm.

Through the fifth step to the ninth step, the production of the single-section ultraviolet LED structure with the waveband of 280 nm is implemented. In order to implement a multi-section ultraviolet LED structure with a waveband of 280 nm, the fifth step to the ninth step may be repeated, which is not limited in this embodiment.

Tenth step: the temperature is maintained at 1100° C., the pressure is maintained at 200 mbar, H2, TMGa (50 ml/min), TMA1 (200 ml/min) and NH3 are introduced, to grow an AlGaN quantum barrier, where the Al composition of the AlGaN is 50%, and a Si impurity is doped, of which the doping concentration is $1\times10^{18}$ cm$^{-3}$. The growth time length is 50 s, and the thickness is 12 nm.

Eleventh step: the temperature is maintained at 1100° C., the pressure is adjusted to 200 mbar, H2, TMGa (50 ml/min), TMA1 (50 ml/min) and NH3 are introduced, to grow an AlGaN quantum barrier, where the Al composition of the AlGaN is 25%, the growth time length is 30 s, and the thickness is 2.5 nm.

Twelfth step: the tenth step to the twelfth step is repeated for 6 cycles to form quantum well structures of 6 periods.

Thirteenth step: the temperature is maintained at 1100° C., the pressure is adjusted to 200 mbar, H2, TMGa (50 ml/min), TMA1 (200 ml/min) and NH3 are introduced, to grow an AlGaN quantum well, where the Al composition of the AlGaN is 50%. The last layer of quantum barrier layer is grown, where the growth time length is 50 s, and the thickness is 12 nm.

Fourteenth step: the temperature is maintained at 1100° C., the pressure is maintained at 200 mbar, H2, TMGa (50 ml/min), TMA1 (200 ml/min) and NH3 are introduced, to grow an AlGaN quantum barrier layer, where the Al composition of the AlGaN is 53%, and an Mgi impurity is doped, of which the doping concentration is $1\times10^{19}$ cm$^{-3}$. A second section electron block layer is grown, where the growth time length is 2 min, and the thickness is 30 nm.

Through the tenth step to the fourteenth step, the production of the single-section ultraviolet LED structure with the waveband of 310 nm is implemented. In order to implement the production of a multi-section ultraviolet LED structure with a waveband of 310 nm, the tenth step to the fourteenth step may be repeated, which is not limited in this embodiment.

Fifteenth step: the temperature is maintained at 1050° C., the pressure is maintained at 200 mbar, H2, TMGa (50 ml/min), TMA1 (200 ml/min) and NH3 are introduced, to grow an AlGaN quantum barrier, where the Al composition of the AlGaN is 42%, and a Si impurity is doped, of which the doping concentration is $1\times10^{18}$ cm$^{-3}$, the growth time length is 50 s, and the thickness is 15 nm.

Sixteenth step: the temperature is maintained at 1050° C., the pressure is adjusted to 200 mbar, H2, TMGa (80 ml/min), TMA1 (50 ml/min) and NH3 are introduced, to grow an AlGaN quantum barrier, where the Al composition of the AlGaN is 10%. The growth time length is 20 s, and the thickness is 3 nm.

Seventeenth step: the sixteenth step to the seventeenth step is repeated for 8 cycles to form a third-section quantum well structure of 8 periods.

Eighteenth step: the temperature is maintained at 1050° C., the pressure is adjusted to 200 mbar, H2, TMGa (50 ml/min), TMA1 (200 ml/min) and NH3 are introduced, to grow an AlGaN quantum well, where the Al composition of the AlGaN is 42%. The last layer of quantum barrier layer is grown, where the growth time length is 50 s, and the thickness is 15 nm.

Nineteenth step: the temperature is maintained at 1050° C., the pressure is adjusted to 200 mbar, H2, TMGa (50 ml/min), TMA1 (250 ml/min) and NH3 are introduced, to grow an AlGaN electron block layer, where the Al composition of the AlGaN is 45%. An Mg impurity is doped, of which the doping concentration is 1×1019 cm-3. A third section electron block layer is grown, where the growth time length is 1 min, and the thickness is 15 nm.

Through the fifteenth step to the nineteenth step, the production of the single-section ultraviolet LED structure with the waveband of 350 nm is implemented. In order to implement the production of a multi-section ultraviolet LED structure with a waveband of 350 nm, the fifteenth step to the nineteenth step may be repeated, which is not limited in this embodiment.

Twentieth step: the temperature is reduced to 900° C., the pressure is adjusted to 200 mbar, H2, TEGa (360 ml/min) and NH3 are introduced, an Mg impurity is doped, of which the doping concentration Mg is $1\times10^{19}$ cm$^{-3}$. A P-type GaN layer is grown, where the growth time length is 40 min, and the thickness is 400 nm.

Twenty-first step: the three-section LED is annealed and is chip-processed into a chip with a size of 1 mm$^2$, to which a current of 350 mA is applied. The wavelengths include three wavelengths of 280 nm, 310 nm and 350 nm, the brightness is 150 mW, and the forward voltage is 6.5V.

In this embodiment of the present disclosure, the production of the multi-ultraviolet LED with multiple wavebands (280 nm, 310 nm and 350 nm) is implemented. The multi-ultraviolet LED with multiple wavebands has functions of sterilization, phototherapy and light curing.

Finally, it should be noted that the above embodiments are merely illustrative of, instead of limiting, the technical solutions of the present disclosure. Although the present disclosure has been described in detail with reference to the foregoing embodiments, those skilled in the art will understand that the technical solutions described in the foregoing embodiments may be modified, or some or all of the technical features may be equivalently replaced, and the modifications or substitutions should not deviate the essence of the technical solutions from the scope of the embodiments of the present disclosure.

What is claimed is:

1. An ultraviolet light emitting diode (LED) epitaxial production method, comprising:
   pre-introducing a metal source and a group-V reactant on a substrate, to form a buffer layer through decomposition at a first temperature;
   growing an N-doped $Al_wGa_{1-w}N$ layer on the buffer layer at a second temperature;
   growing a multi-section LED structure on the N-doped $Al_wGa_{1-w}N$ layer at a third temperature, wherein a number of sections of the multi-section LED structure is in a range of 2 to 50; and
   each section of the LED structure comprises an $Al_xGa_{1-x}N/Al_yGa_{1-y}N$ multi-quantum well structure and a P-doped $Al_mGa_{1-m}N$ layer, and the multi-section LED structure emits light of one or more wavelengths.

2. The method according to claim 1, further comprising:
   growing an undoped $Al_yGa_{1-y}N$ layer on the buffer layer, and growing the N-doped $Al_wGa_{1-w}N$ layer on the undoped $Al_yGa_{1-y}N$ layer.

3. The method according to claim 1, further comprising:
   growing a P-doped GaN layer on the multi-section LED structure, a thickness of the P-doped GaN layer is in a range of 0 to 500 nm, and a doping concentration of the P-doped GaN layer is $1*10^{17}$ to $1*10^{20}$ cm$^{-3}$.

4. The method according to claim 1, wherein,
   a thickness of the N-doped $Al_wGa_{1-w}N$ layer is in a range of 500 nm to 4000 nm, and a doping concentration of the N-doped $Al_wGa_{1-w}N$ layer is $1*10^{17}$ to $5*10^{19}$ cm$^{-3}$;
   a thickness of the $Al_mGa_{1-m}N$ layer is in a range of 5 nm to 100 nm, and a doping concentration of the P-doped $Al_mGa_{1-m}N$ layer is $1*10^{17}$ to $1*10^{20}$ cm$^{-3}$.

5. The method according to claim 1, wherein a thickness of the buffer layer is in a range of 0 to 5000 nm.

6. The method according to claim 1, wherein the substrate is one of sapphire, Si, SiC, Glass, Cu, Ni and Cr.

7. The method according to claim 1, wherein,
   a number of periods of the $Al_xGa_{1-x}N/Al_yGa_{1-y}N$ multi-quantum well structure in each section of the LED structure is in a range of 2 to 50, a thickness of a period of the $Al_xGa_{1-x}N/Al_yGa_{1-y}N$ multi-quantum structure is in a range of 5 nm to 30 nm.

8. The method according to claim 2, wherein,
   a number of periods of the $Al_xGa_{1-x}N/Al_yGa_{1-y}N$ multi-quantum well structure in each section of the LED structure is in a range of 2 to 50, a thickness of a period of the $Al_xGa_{1-x}N/Al_yGa_{1-y}N$ multi-quantum structure is in a range of 5 nm to 30 nm.

9. The method according to claim 3, wherein,
   a number of periods of the $Al_xGa_{1-x}N/Al_yGa_{1-y}N$ multi-quantum well structure in each section of the LED structure is in a range of 2 to 50, a thickness of a period of the $Al_xGa_{1-x}N/Al_yGa_{1-y}N$ multi-quantum structure is in a range of 5 nm to 30 nm.

10. The method according to claim 4, wherein,
    a number of periods of the $Al_xGa_{1-x}N/Al_yGa_{1-y}N$ multi-quantum well structure in each section of the LED structure is in a range of 2 to 50, a thickness of a period of the $Al_xGa_{1-x}N/Al_yGa_{1-y}N$ multi-quantum structure is in a range of 5 nm to 30 nm.

11. The method according to claim 5, wherein,
    a number of periods of the $Al_xGa_{1-x}N/Al_yGa_{1-y}N$ multi-quantum well structure in each section of the LED structure is in a range of 2 to 50, a thickness of a period of the $Al_xGa_{1-x}N/Al_yGa_{1-y}N$ multi-quantum structure is in a range of 5 nm to 30 nm.

12. The method according to claim 1, wherein,
    in the $Al_xGa_{1-x}N/Al_yGa_{1-y}N$ multi-quantum well structure, an Al content of a quantum barrier layer $Al_xGa_{1-x}N$ is higher than an Al content of a quantum well layer $Al_yGa_{1-y}N$.

13. The method according to claim 2, wherein,
    in the $Al_xGa_{1-x}N/Al_yGa_{1-y}N$ multi-quantum well structure, an Al content of a quantum barrier layer $Al_xGa_{1-x}N$ is higher than an Al content of a quantum well layer $Al_yGa_{1-y}N$.

14. The method according to claim 3, wherein,
    in the $Al_xGa_{1-x}N/Al_yGa_{1-y}N$ multi-quantum well structure, an Al content of a quantum barrier layer $Al_xGa_{1-x}N$ is higher than an Al content of a quantum well layer $Al_yGa_{1-y}N$.

15. The method according to claim 4, wherein,
    in the $Al_xGa_{1-x}N/Al_yGa_{1-y}N$ multi-quantum well structure, an Al content of a quantum barrier layer $Al_xGa_{1-x}N$ is higher than an Al content of a quantum well layer $Al_yGa_{1-y}N$.

16. The method according to claim 1, wherein,
    an Al content of the P-doped $Al_mGa_{1-m}N$ layer in each section of the LED structure is higher than an Al content of the quantum well layer $Al_yGa_{1-y}N$;
    an Al content of the N-doped $Al_wGa_{1-w}N$ layer is higher than an Al content of the quantum well layer $Al_yGa_{1-y}N$ in each section of the LED structure.

17. The method according to claim 2, wherein,
    an Al content of the P-doped $Al_mGa_{1-m}N$ layer in each section of the LED structure is higher than an Al content of the quantum well layer $Al_yGa_{1-y}N$;
    an Al content of the N-doped $Al_yGa_{1-y}N$ layer is higher than an Al content of the quantum well layer $Al_yGa_{1-y}N$ in each section of the LED structure.

18. The method according to claim 3, wherein,
    an Al content of the P-doped $Al_mGa_{1-m}N$ layer in each section of the LED structure is higher than an Al content of the quantum well layer $Al_yGa_{1-y}N$;
    an Al content of the N-doped $Al_wGa_{1-w}N$ layer is higher than an Al content of the quantum well layer $Al_yGa_{1-y}N$ in each section of the LED structure.

19. The method according to claim 4, wherein,
    an Al content of the P-doped $Al_mGa_{1-m}N$ layer in each section of the LED structure is higher than an Al content of the quantum well layer $Al_yGa_{1-y}N$;
    an Al content of the N-doped $Al_wGa_{1-w}N$ layer is higher than an Al content of the quantum well layer $Al_yGa_{1-y}N$ in each section of the LED structure.

20. An ultraviolet light emitting diode (LED), wherein, the ultraviolet LED is produced using the ultraviolet LED epitaxial production method according to claim 1.

* * * * *